United States Patent
Beitel et al.

(10) Patent No.: US 6,825,116 B2
(45) Date of Patent: Nov. 30, 2004

(54) METHOD FOR REMOVING STRUCTURES

(75) Inventors: Gerhard Beitel, Mühldorf/Inn (DE);
Mattias Ahlstedt, München (DE);
Walter Hartner, Glen Allen, VA (US);
Günther Schindler, München (DE);
Marcus Kastner, Ottobrunn (DE);
Volker Weinrich, Paris (FR)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 09/845,405

(22) Filed: Apr. 30, 2001

(65) Prior Publication Data
US 2002/0019138 A1 Feb. 14, 2002
(Under 37 CFR 1.47)

(30) Foreign Application Priority Data
Apr. 28, 2000 (DE) .......................................... 100 22 656

(51) Int. Cl.[7] .............................................. H01L 21/302
(52) U.S. Cl. ........................ 438/691; 438/692; 438/693; 438/700
(58) Field of Search ................................. 438/690, 691, 438/692, 693, 700, 710, 712, 697

(56) References Cited

U.S. PATENT DOCUMENTS

| 5,335,138 A | | 8/1994 | Sandhu et al. |
| 5,434,107 A | * | 7/1995 | Paranjpe ...................... 438/230 |
| 5,702,869 A | * | 12/1997 | Chien et al. .................. 430/313 |
| 5,872,401 A | * | 2/1999 | Huff et al. .................... 257/758 |
| 5,874,764 A | * | 2/1999 | Hsieh et al. .................. 257/401 |
| 5,885,900 A | | 3/1999 | Schwartz |
| 5,920,792 A | | 7/1999 | Lin |
| 5,945,724 A | | 8/1999 | Parekh et al. |
| 5,955,759 A | * | 9/1999 | Ismail et al. .................. 257/332 |
| 6,022,788 A | | 2/2000 | Gandy et al. |
| 6,030,866 A | * | 2/2000 | Choi ........................... 438/253 |
| 6,037,264 A | | 3/2000 | Hwang |
| 6,180,525 B1 | * | 1/2001 | Morgan ...................... 438/692 |
| 6,344,413 B1 | * | 2/2002 | Zurcher et al. .............. 438/678 |
| 6,346,741 B1 | * | 2/2002 | Van Buskirk et al. ....... 257/664 |

FOREIGN PATENT DOCUMENTS

| WO | WO 00/59011 | 10/2000 |
| WO | WO 00/77841 A1 | 12/2000 |

\* cited by examiner

*Primary Examiner*—Lan Vinh
(74) *Attorney, Agent, or Firm*—Laurence A. Greenberg; Werner H. Stemer; Ralph E. Locher

(57) ABSTRACT

A method for removing structures from a substrate is described. The method includes providing a substrate that has the structures that must be removed, applying a sacrifice layer, and removing the structures and the sacrifice layer in a polishing step. The method has the advantage that the sacrifice layer surrounds the structures that must be removed and stabilizes them, so that the structures can be eroded slowly and successively in the subsequent polishing step without breaking off. This prevents a smearing of the material of the structures such as occurs given direct polishing without a sacrifice layer.

10 Claims, 6 Drawing Sheets

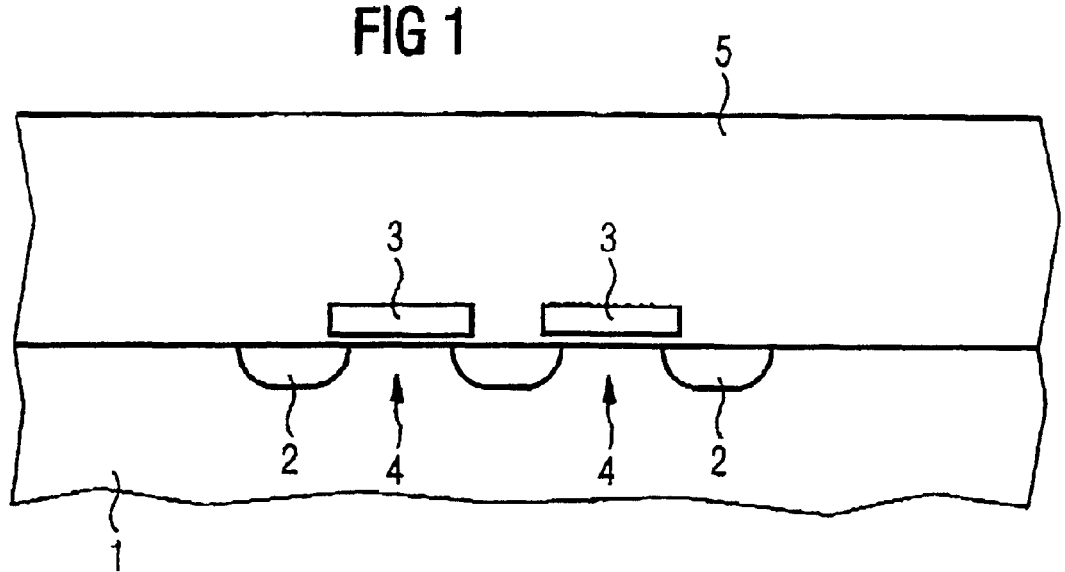
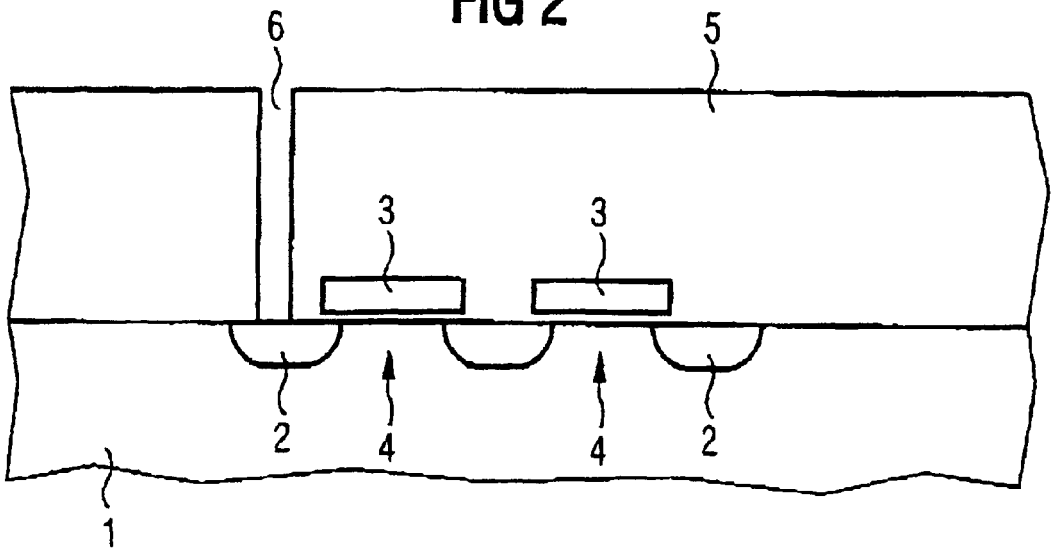

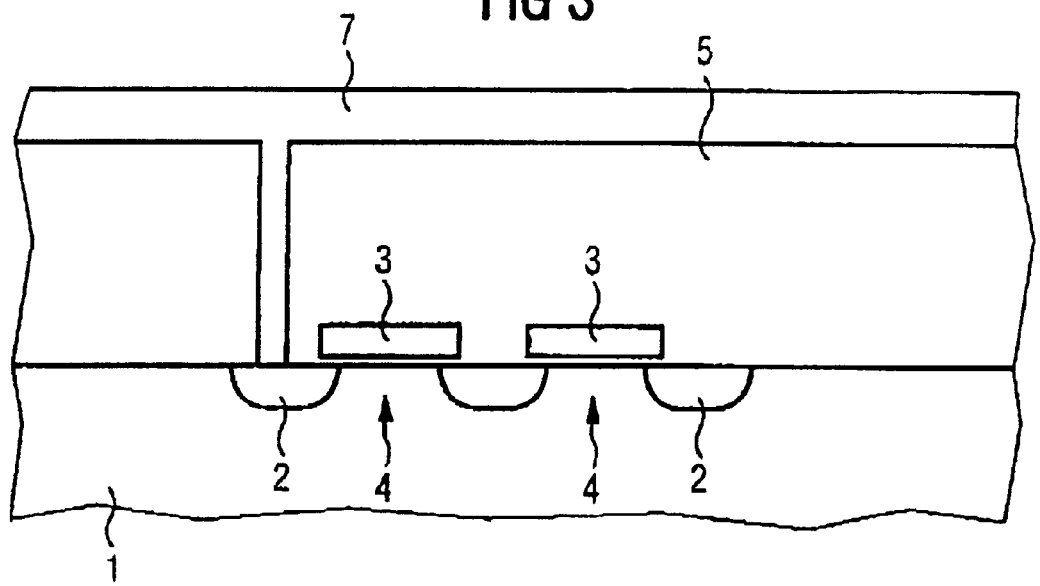
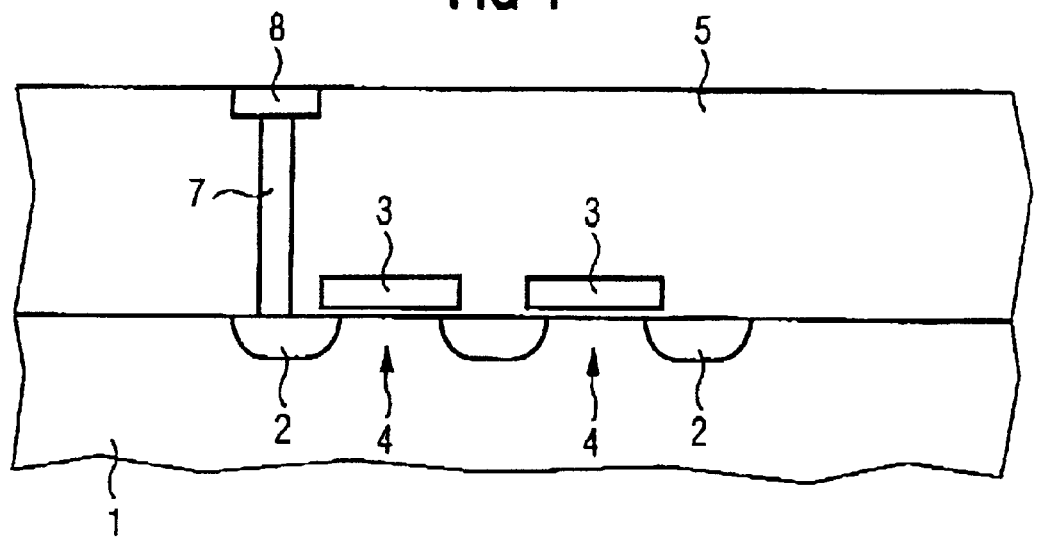

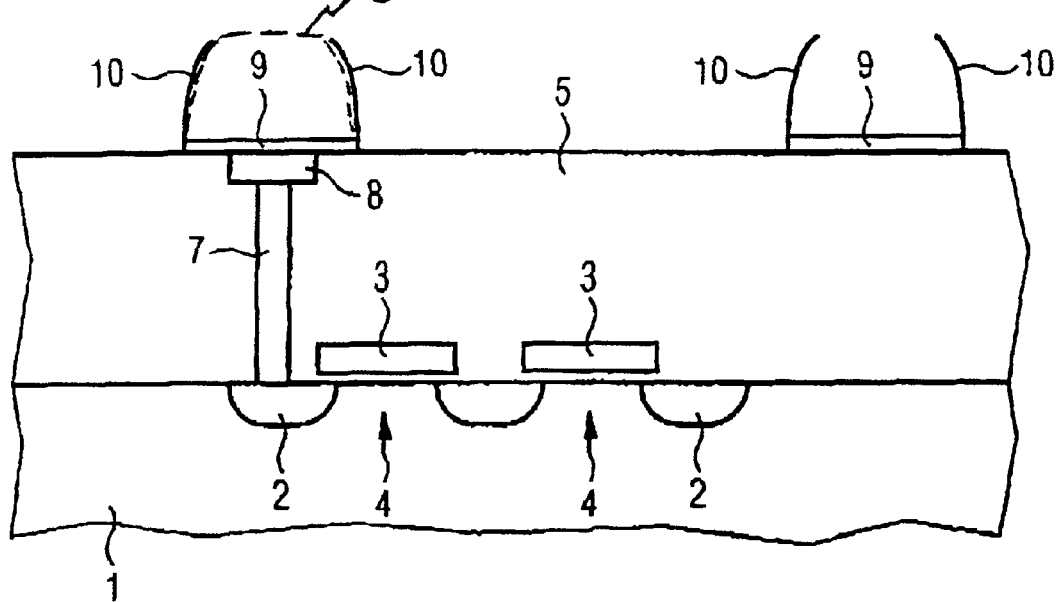
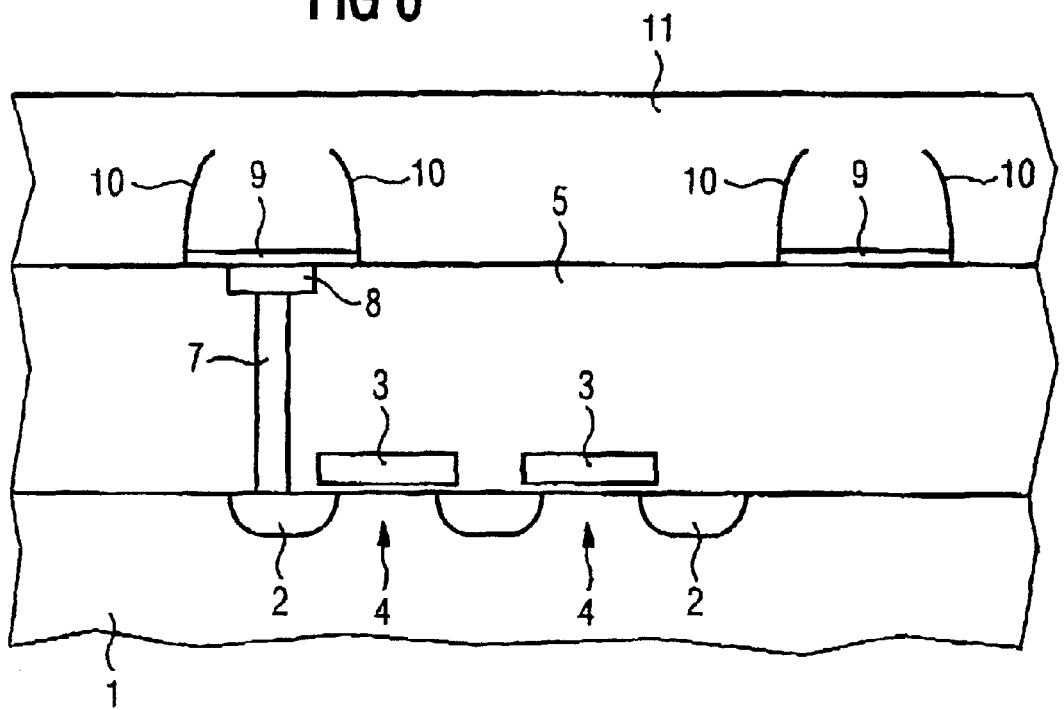

METHOD FOR REMOVING STRUCTURES

BACKGROUND OF THE INVENTION

FIELD OF THE INVENTION

The invention relates to a method for removing structures.

Specifically, the invention relates to a method for removing structures that can emerge in the production of ferroelectric storage capacitors. The invention also relates to a method for producing one or more structured layers.

To produce ferroelectric capacitors for use in non-volatile semiconductor memories of high integration density, a ferroelectric material—e.g. $SrBi_2(Ta, Nb)_2O_9$ (SBT or SBTN, $Pb(Zr, Ti)O_3$ (PZT), or $Bi_4Ti_3O_{12}$ (BTO)—is used as the dielectric between the electrodes of a capacitor. It is also possible to use paraelectric materials, such as $(Ba, Sr)TiO_3$ (BST). In these types of capacitors, the electrode material is usually a noble metal that resists high temperatures in an oxygen atmosphere. Possible materials include Pt, Pd, Ir, Rh, Ru, $RuO_x$, $SrRuO_3$, LSCO ($LaSrCoO_x$) and high-temperature superconductors (e.g. $YBa_2CU_3O_7$). In general, capacitor construction proceeds in accordance with either the more technologically demanding stacking principle or the space consuming offset cell principle.

In both variants, processing steps are necessary in order to structure the top and bottom electrodes. The structuring of new electrode materials (such as platinum) in the microelectronics for large-scale integrated memory modules is typically accomplished with plasma processing steps using gas mixtures of what are known as reactive gasses (e.g. chlorine) and noble gasses (e.g. argon). A photosensitive resist is usually used as a mask material in the process. The erosion of material in the non-masked regions on the substrate is accomplished by sputter erosion by firing chlorine and argon ions. In order to be able to realize extremely fine structures in the correct dimensions, it is necessary to transfer the structure of the resist mask onto the platinum layer that is to be structured without altering the critical dimension (CD). But the sputter attack of the ions, as well as the intermediate formation of redepositions, leads to faceting (beveling, tapering) of the mask, particularly in the presence of reactive gasses, and thus to a corresponding faceting in the transfer of the structure into the platinum. The faceting limits the smallest structural sizes that can be achieved in the platinum structuring. Incidentally, the most intense faceting occurs in pure chlorine plasmas.

As the argon fraction in the chlorine-argon gas mixture increases, the edge angle of the resulting platinum structure increases. The utilization of a pure noble gas as a processing gas leads to practically no faceting of the resist mask in the plasma etching. As a consequence, the etched edges that are obtained form the optimal angle (>80°), and only minimal expansion occurs (CD gain 30–50 nm/edge). But the buildup of redepositions at the sidewall of the resist mask also increases as the argon fraction in the gas mixture grows. The redepositions consist of a material of the structured layer. In many cases, the redeposited films cannot be removed by wet chemical processes, or a removal of the redepostied material by wet chemical processes leads to intensive damaging of the original film that was structured. FIG. 11 shows a slide of such redepositions (also known as fences) as can arise in the production of a ferroelectric capacitor (bottom platinum electrode, ferroelectric SBT layer, top platinum electrode).

Steep side edges can also be created by carrying out a plasma etching process at high temperatures (>200° C.), preferably using a heated cathode. At higher temperatures, many of the above-mentioned materials form volatile compounds with the processing gasses. However, the procedure is disadvantageous in that it requires a hard mask instead of a standard resist mask. This requires additional processing and structuring steps than a resist mask does. Also, the removal of the hard mask, which is necessary following the structure transfer, leads to an undesirable enlargement of the topography due to etching-on of the underlay. Another problem is that the equipment that is needed for the high-temperature etching is not yet commercially available and furthermore is very expensive.

Attempts have also been made to eliminate the problem by using processes leading to heavy faceting of the mask (e.g. chlorine-rich processes). After the faceting to an angle of approximately 50°, the redepositions at the edges of the mask are advantageously etched relative to the film being etched, since they form an angle relative to the impinging ions at which the sputter erosion is greatest. One thus obtains structures without redepositions. However, the procedure has the disadvantage that, the redeposition-free process comes at the price of flat, sharply angled structural edges (<<90°) and associated CD alterations. The process is unsuitable for etching thin metal layers, since a faceting of the mask is not achieved in the shorter processing times.

Beyond this, it has also been attempted to eliminate the problem using a two-stage process of plasma etching and removal of the redepositions by polishing, ultrasound action, or high-pressure liquid jets. The steepest edge angles are obtained using pure argon plasmas. The redepositions that are generated are removed in a second step by sound influences, polishing or a high-pressure jet, for instance with organic solvent. The disadvantage of the removal of redepositions by simple polishing is that the redepositions break off in the polishing process, and the material of the redepositions is spread (smeared) on the substrate by the polishing, which can lead to damage to the structures that have already been formed.

Furthermore, the redepositions (fences) warp during the normal incinerating of the photosensitive resist. If the level of the resist and thus of the redepositions is lower than the structural size of the structure being etched, then resist often lies buried under the redepositions. This smears together with the dislodged redepositions in the grinding process. Given ultrasound processing, the redepositions frequently break off to half their height. The sound couples less effectively into the now shorter structures. This results in processes that are very long or that achieve incomplete removal of the fences. Besides this, special equipment, which is expensive, is needed for the cleaning process using a high-pressure liquid jet (80 atm).

SUMMARY OF THE INVENTION

It is accordingly an object of the invention to provide a method for removing structures which overcomes the above-mentioned disadvantages of the prior art methods of this general type.

With the foregoing and other objects in view there is provided, in accordance with the invention, a method for removing structures. The method includes the steps of providing a substrate having the structures to be removed; depositing a sacrifice layer on the structures and the substrate; and removing the structures and the sacrifice layer in a polishing step.

The inventive method has the advantage that the sacrifice layer surrounds the structures that are to be removed and stabilizes them, making it possible to slowly and successively erode the structures in the subsequent polishing step without the structures breaking off. This prevents a smearing of the material of the structures that are to be removed, such as occurs given direct polishing without a sacrifice layer. Since the sacrifice layer is a matter of a layer that has no function of its own in the structure being produced, artifacts that are conditional to the polishing step, such as what is known as "dishing", as well as unevenness, over polishing, and so on, are of minor significance.

In addition, an inventive method for producing one or more structured layers is proposed. The method starts by obtaining a substrate, at least one layer is applied to the substrate for structuring, a mask is placed on the layer that must be structured, the layer being structured is etched by a dry etching process, whereby redepositions of the layer being structured emerge at the sidewalls of the mask, the mask is removed, a sacrifice layer is applied and in a polishing step, the redepositions of the layer being structured and the sacrifice layer are removed, and a structured layer emerges.

An advantage of the inventive method is that materials which materials are difficult to etch can be etched with high physical components, and the redepositions (fences) that emerge can be removed again without substantial residues. It is thus possible to use the desired low dimensional expansion in the etching with high physical components, despite the redepositions.

According to a preferred embodiment, the material of the structures that must be removed is a noble metal, particularly Pt or Ir, an oxide of a noble metal, a dielectric material, or a ferroelectric material.

In accordance with a preferred embodiment, the structures that must be removed have an aspect ratio of greater than 2, and preferably greater than 4. Furthermore, it is preferable to carry out the polishing step as a chemical mechanical polishing step.

It is also preferable to use a silicon oxide layer and/or a silicon nitride layer as the sacrifice layer. In accordance with a preferred embodiment, the polishing step is interrupted, and residue of the mask is removed. It is particularly preferable to remove the residue of the sacrifice layer after the polishing step by wet chemical processes.

Other features which are considered as characteristic for the invention are set forth in the appended claims.

Although the invention is illustrated and described herein as embodied in a method for removing structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–10 are diagrammatic, partial sectional views of a structure and associated method steps according to a first embodiment of the invention.

DESCRIPTION OF THE PREFERRED EMBODIMENTS

Figure 7:
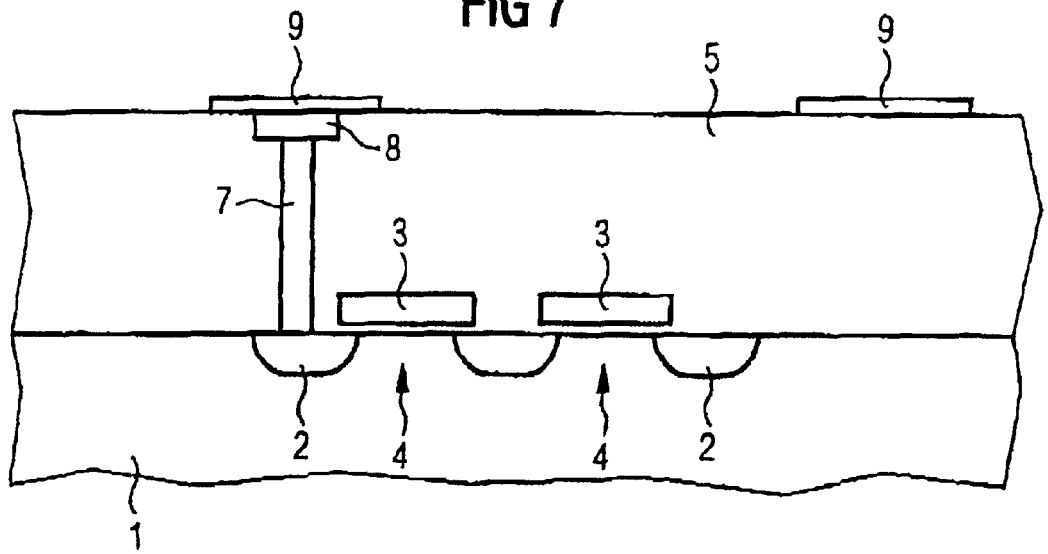

In all the figures of the drawing, sub-features and integral parts that correspond to one another bear the same reference symbol in each case. Referring now to the figures of the drawing in detail and first, particularly, to FIG. 1 thereof, there is shown a silicon substrate 1 with finished transistors 4. The transistors 4, along with memory capacitors that will be produced, form memory cells that serve to store binary information. The transistors 4 each have two diffusion zones 2, which are disposed at a surface of the silicon substrate 1. Channel zones are disposed between the diffusion zones 2 of the transistors 4 and are separated by a gate oxide of gate electrodes 3 on the surface of the silicon substrate 1. The transistors 4 are produced by methods that are known from the prior art, which are not described in detail here.

An insulating layer 5, for instance an $SiO_2$ layer, is applied to the silicon substrate 1 with the transistors 4. Depending on the method that is used to produce the transistors 4, it is possible to deposit several insulating layers. The resulting structure is shown in FIG. 1.

Next, a contact hole 6 is generated by a photolithography technique. The contact hole 6 produces a connection between the transistors 4 and the storage capacitor that will be produced. This way, a memory cell can be generated according to the stacking principle. The contact hole 6 is generated by an anisotropic etching with fluorine-rich gasses. The structure that emerges is represented in FIG. 2.

Next, a conductive material 7, for instance in situ doped polysilicon, is applied to the structure. This can occur by a chemical vapor deposition (CVD) method. Applying the conductive material 7 completely fills the contact hole 6, and a contiguous conductive layer emerges on the insulating layer 5 (see FIG. 3). Next, in a chemical mechanical polishing (CMP) step, the contiguous conductive layer 7 on the surface of the insulating layer 5 is removed, and a flat surface is created (see FIG. 4).

A depression is then formed in the insulating layer 5 such that it overlaps with the contact hole 6. The depression is now filled with a barrier material 8, such as iridium oxide, to a predetermined level. This is accomplished by depositing the barrier material 8 surface-wide and then performing an anisotropic etching. The anisotropic etching is continued until a flat surface is obtained. The barrier material 8 can be structured by a CMP step as well. The structure that emerges is represented in FIG. 4.

Next, a conductive layer 9, for instance a Pt layer, is applied to the structure represented in FIG. 4 in order to form a bottom electrode. The platinum can be applied by a sputter method. Next, a resist mask 30, shown in dashed lines, is applied to the Pt layer 9, and the Pt layer 9 is structured by a plasma etching method using a pure argon plasma. Because pure noble gas is used as the process gas, practically no faceting of the resist mask 30 occurs. As a consequence, the etching edge that is obtained forms the optimal angle (>80°), and only a minimal expansion occurs (CD gain 30–50 nm/edge). But the use of pure argon plasma also leads to redepositions 10 of platinum at the sidewalls of the resist mask 30. The redepositions 10 (fences) have a very large aspect ratio of approximately 10:1. After the structuring of the platinum layer 9, the resist mask 30 is incinerated, so that the redepositions 10 are left behind on the substrate 1. The structure that emerges is represented in FIG. 5.

The redepositions 10 would interfere with the subsequent production of the capacitors; therefore, they must be removed from the substrate 1. To remove the redepositions 10, a silicon oxide layer 11 is applied as a sacrifice layer. The silicon oxide layer 11 surrounds the redepositions 10 and stabilizes them. The thickness of the sacrifice layer 11 is between 100 nm and 1.5 μm, and preferably between 500 and 700 μm. The structure that emerges is represented in FIG. 6. Next, a CMP step is carried out, in which the silicon oxide layer 11 and the redepositions 10 are removed from the substrate. By virtue of the silicon oxide layer 11, the redepositions 10 can be slowly and successively eroded in the CMP step without the redepositions 10 breaking off. This prevents the material of the redeposition 10 from being smeared, as occurs given direct polishing without a sacrifice layer. Since the silicon oxide layer 11 is a matter of a layer which has no function of its own in the structure being produced, artifacts that are conditional to the polishing step, such as "dishing", unevenness, over polishing, and so on, are of minor significance.

In the present exemplifying embodiment, the CMP step can be performed as a conventional CMP process for oxide layers. For example, Klebosol 30N50 can be used as the slurry, and a Rodel IC1000 or IC14000 pad can be used as the pad. The polishing pressure equals between 2 and 8 psi, and the rotation rate of the polishing plate and the wafer carrier equals between 20 and 100 U/min.

The CMP step is stopped as soon as the silicon oxide layer 11 is eroded to the platinum layer 9. Next, the residues of the silicon oxide layer 11 which are still located on the substrate 1 are removed therefrom in another etching step, which is advantageously performed by wet chemical processes. Thus, the side surfaces of the bottom electrodes are also available for raising the capacity of the capacitors that will be created. The situation that emerges is represented in FIG. 7.

Figure 11:
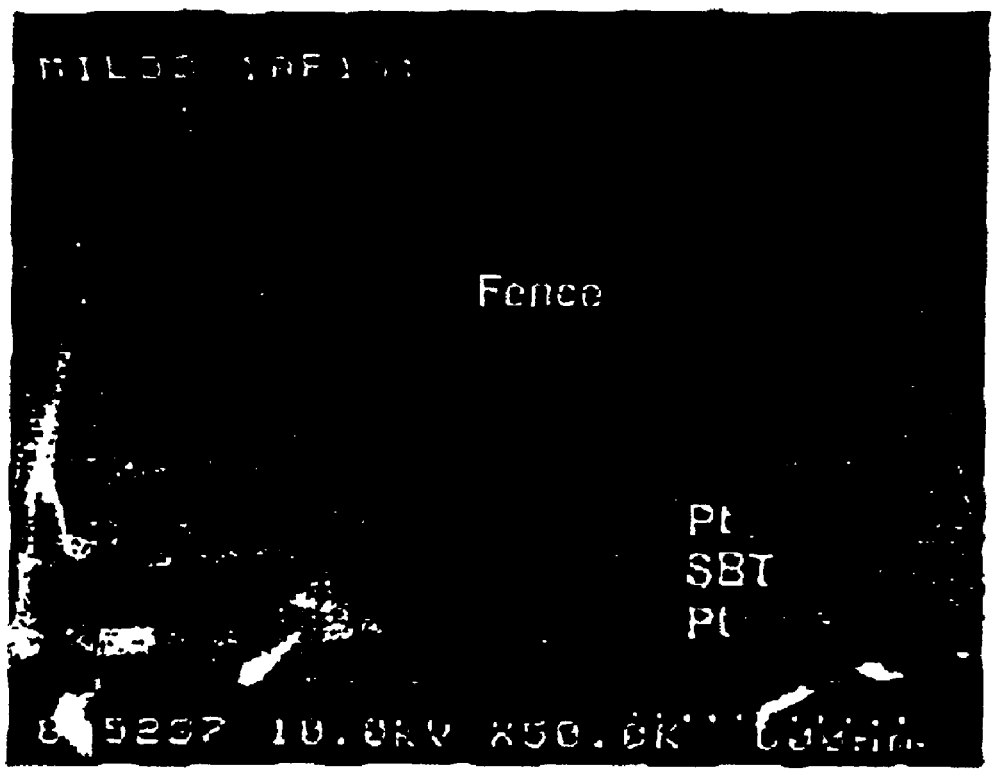
FIG. 11 is a photograph of redepositions.

If the redepositions warp in the incinerating of the resist mask, as is represented in FIG. 11, residues of the resist mask may remain between the redepositions. This is usually the case when the spacing of the redepositions is less than 2 um. It is thus advantageous to interrupt the CMP step and to incinerate the exposed resist residue before continuing the CMP step. Furthermore, the removal of the residues of the silicon oxide layer 11 that remain on the substrate 1 after the CMP step can be forgone if, for example, the sidewalls of the bottom electrode are not needed to increase the capacity.

Next, a material is deposited for a ferroelectric layer 12, for instance for a layer of strontium bismuth talantate (SBT).

This type of SBT layer is deposited onto the structure shown in FIG. 7 by a CVD process. The CVD process is carried out at a substrate temperature of 385° C. and a chamber pressure of approximately 1200 Pa. The oxygen fraction in the gas mixture equals 60%. The SBT film is deposited as an amorphous film. Accordingly, the SBT film exhibits essentially no ferroelectric characteristics yet. Next, the deposited amorphous SBT is tempered in an oxygen atmosphere for 10 to 30 minutes at a temperature between 600 and 750° C., thereby generating the ferroelectric characteristics of the SBT.

Next, another conductive layer 13, for instance a Pt layer, is applied to the ferroelectric layer 12 to form the top electrode. The Pt layer 13 can be applied by a sputter method. Next, a resist mask (which is not included in the drawing) is applied to the Pt layer 13, and the Pt layer 13 and the ferroelectric layer 12 are structured by a plasma etching method using a pure argon plasma. Because a pure argon plasma is used, redepositions 14 of platinum occur at the sidewalls of the resist mask. After the platinum layer 13 and the ferroelectric layer 12 are structured, the resist mask is incinerated, so that the redepositions 14 are left behind on the substrate.

Figure 8:
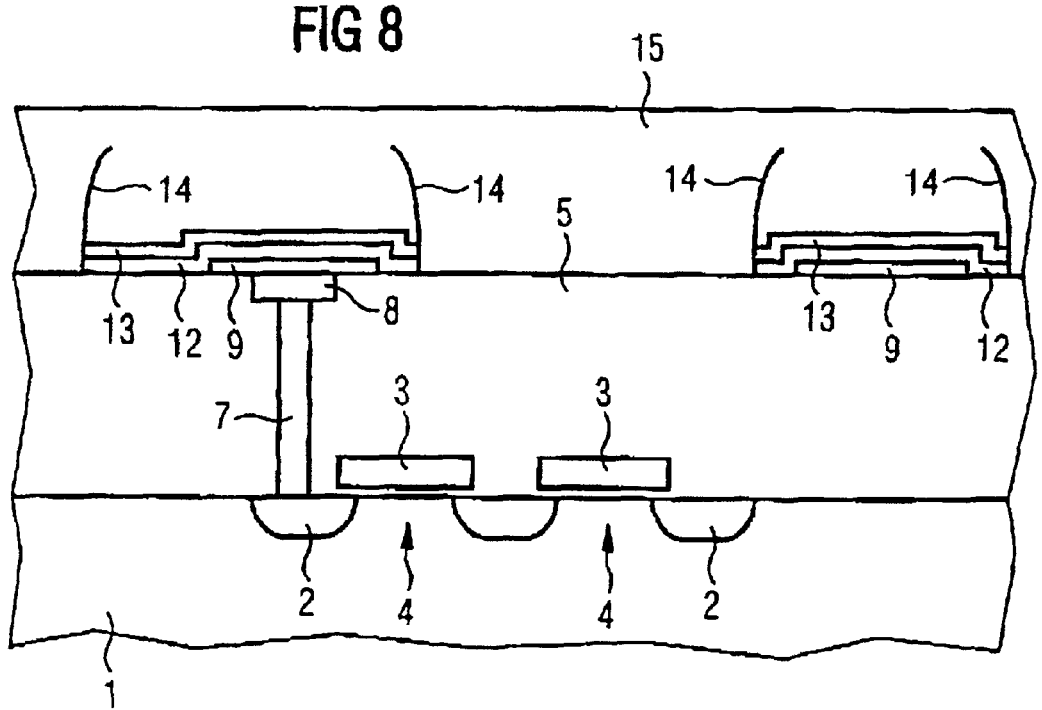

The redepositions 14 would interfere substantially with the subsequent production of the integrated circuit or memory module; therefore, they must be removed from the substrate. A silicon oxide layer 15 is now deposited as the sacrifice layer for the purpose of removing the redepositions 14. The silicon oxide layer 15 surrounds the redepositions 14 and stabilizes them. The structure that emerges is represented in FIG. 8.

Figure 9:
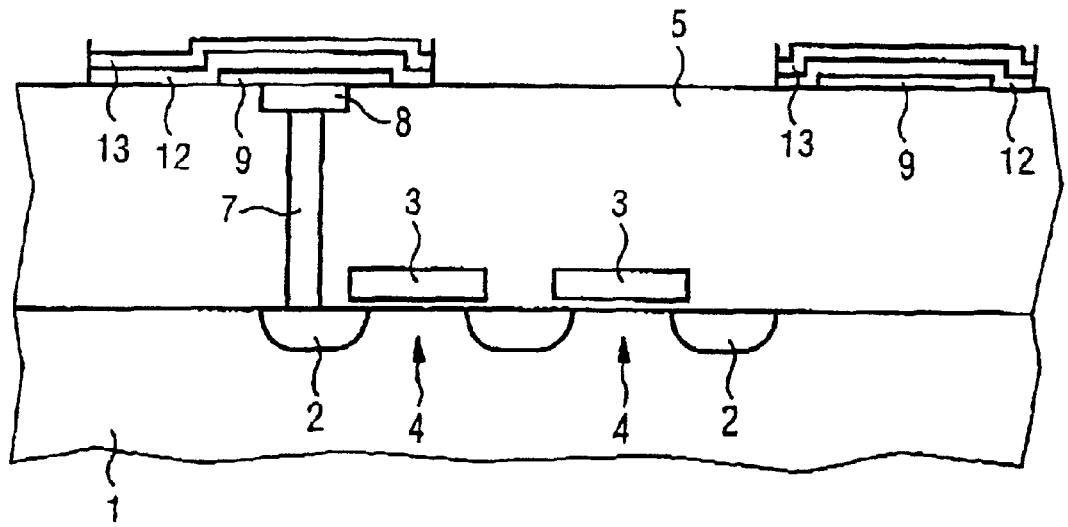

Next, an additional CMP step is carried out, in which the silicon oxide layer 15 and the redepositions 14 are removed from the substrate 1. By virtue of the silicon oxide layer 15, the redepositions 14 can be slowly and successively eroded in the CMP step without breaking off. The CMP step can be carried out as a conventional CMP process for oxide layers. The CMP step is stopped as soon as the silicon oxide layer 15 is eroded to the platinum layer 13. The remaining residue of the redepositions 14 is of no significance to the subsequent production process (see FIG. 9).

Figure 10:
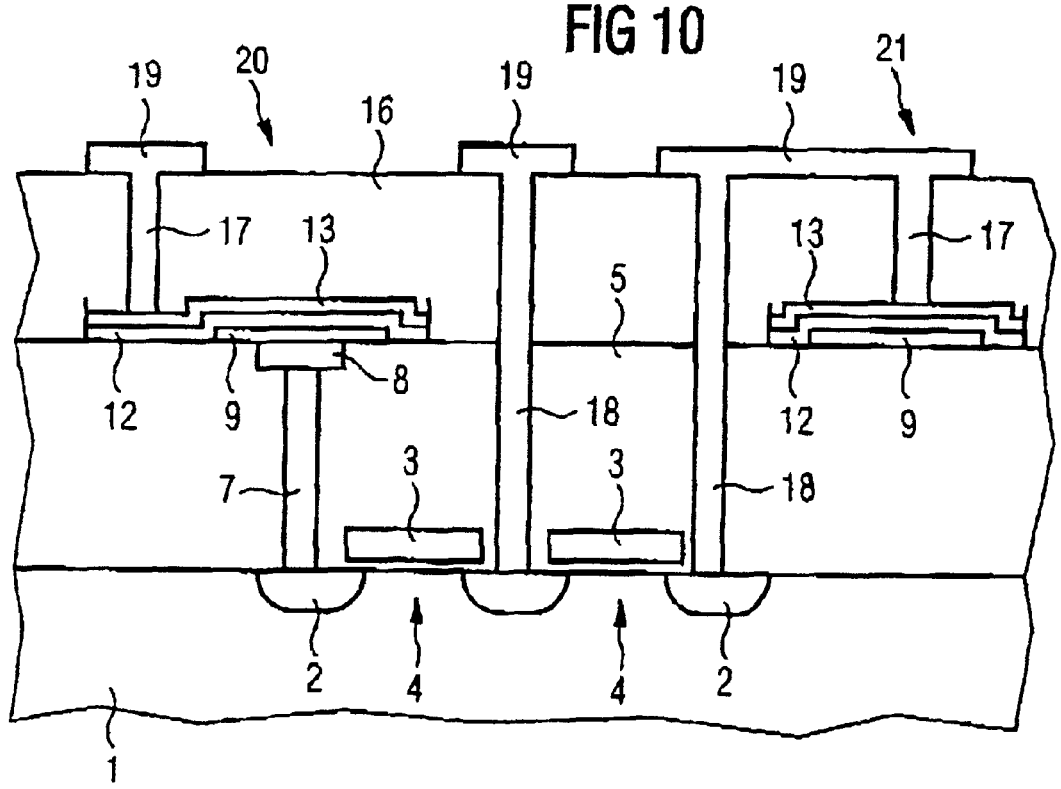

In order to electrically insulate the electrode layer 13 from new levels of interconnects, the conductive layer 13 is covered by an insulating cover layer 16, for instance silicon oxide. Next, in order to electrically contact the top electrodes 13 and the diffusion zones 2 of the transistors 4, which are located beneath the insulating layer 5, corresponding contact holes are etched through the various silicon oxide layers 16 and 5. Contact holes 17 terminate on the top Pt electrodes 13; additional contact holes 18 run past the Pt-SBT layers to the diffusion zones 2 of the selection transistors 4. An additional conductive layer 19 is then deposited, so that the contact holes 17 and 18 are filled (see FIG. 10). Thus, a memory cell 20 on the left side of FIG. 10 has been created in accordance with the stacking principle, while a memory cell 21 on the right side of FIG. 10 has been created in accordance with the offset principle. Next, the metallization planes and the passivation of the component are created as usual. It is noted that in industrial applications, only one type of memory cell, either a stack cell or an offset cell, is usually produced on a chip. In this regard, the FIGS. 1 to 10 should be understood merely as an illustration of the basic procedure.

We claim:

1. A method for removing structures to be removed, which comprises the steps of:
    providing a substrate having the structures to be removed on the substrate, the structures to be removed having an aspect ratio of greater than 2 and being formed from a material selected from the group consisting of noble metals, oxides of noble metals, and ferroelectric materials;
    depositing a sacrificial layer on the structures to be removed and the substrate; and
    removing the structures to be removed and the sacrificial layer in a polishing step.

2. The method according to claim 1, which comprises forming the sacrificial layer from at least one of a silicon oxide layer and a silicon nitride layer.

3. The method according to claim 1, which comprises forming the structures that must be removed with an aspect ratio of greater than 4.

4. The method according to claim 1, which comprises carrying out a chemical mechanical polishing process as the polishing step.

5. The method according to claim 4, which comprises removing residues of the sacrificial layer by wet chemical processes following the chemical mechanical polishing process.

6. A method for producing at least one structured layer, which comprises the steps of:
    providing a substrate;

applying at least one layer to the substrate for structuring;

applying a mask to the layer to be structured;

etching the layer being structured by a dry etching method, so that redepositions of the layer emerge at sidewalls of the mask;

removing the mask;

applying a sacrificial layer; and performing a polishing step to remove the redepositions of the layer being structured, and to remove the sacrificial layer, so that a structured layer emerges.

7. The method according to claim 6, which comprises forming the layer from a material selected from the group consisting of noble metals, an oxide of the noble metals, a dielectric material and a ferroelectric material.

8. The method according to claim 6, which comprises interrupting the polishing step and removing residues of the mask.

9. The method according to claim 6, which comprises performing a chemical mechanical polishing process as the polishing step.

10. The method according to claim 6, which comprises forming the sacrificial layer from at least one of a silicon oxide layer and a silicon nitride layer.

* * * * *